(12) United States Patent
Yagi et al.

(10) Patent No.: US 6,355,874 B1
(45) Date of Patent: Mar. 12, 2002

(54) SEMICONDUCTOR DEVICE AND SOLAR CELL

(75) Inventors: Shigeru Yagi; Seiji Suzuki, both of Minamiashigara (JP)

(73) Assignee: Fuji Xerox Co., Ltd., Tokyo (JP)

( * ) Notice: Subject to any disclaimer, the term of this patent is extended or adjusted under 35 U.S.C. 154(b) by 0 days.

(21) Appl. No.: 09/625,315

(22) Filed: Jul. 25, 2000

(30) Foreign Application Priority Data

Aug. 3, 1999 (JP) .......................................... 11-219998
Feb. 23, 2000 (JP) .......................................... 12-046345

(51) Int. Cl.[7] ..................... H01L 31/0232; H01L 31/04; H01L 31/0264
(52) U.S. Cl. ..................... 136/252; 136/261; 136/262; 136/265; 136/256; 136/258; 257/189; 257/52; 257/66; 257/76; 257/461; 257/434
(58) Field of Search ................................. 136/252, 261, 136/262, 265, 256, 258; 257/189, 52, 66, 76, 461, 434

(56) References Cited

U.S. PATENT DOCUMENTS

| | | | |
|---|---|---|---|
| 4,107,723 A | * | 8/1978 | Kamath ...................... 136/262 |
| 4,139,858 A | * | 2/1979 | Panvoke ...................... 136/256 |
| 5,422,304 A | * | 6/1995 | Kohiki et al. .................. 438/95 |
| 5,767,581 A | * | 6/1998 | Nakamura et al. .......... 257/749 |

FOREIGN PATENT DOCUMENTS

DE     19715761 A1   * 10/1998

* cited by examiner

Primary Examiner—Alan Diamond
(74) Attorney, Agent, or Firm—Oliff & Berridge, PLC

(57) ABSTRACT

The present invention provides a semiconductor device and a solar cell, which may be low-cost, highly efficient, safe, and last long. The semiconductor device has a compound semiconductor layer as a window layer including nitride compound semiconductor of at least one element selected from a group of Al, Ga and In and nitrogen, formed on a semiconductor substrate. The solar cell has a compound semiconductor layer containing a nitride compound semiconductor defined by a composition formula $Al_xGa_yN_W$ on a semiconductor substrate, where X, Y, Z and W represent a composition ratio, and satisfy $0.8 \leq (X+Y+Z)/W \leq 1.2$ and $0.1 \leq Z/(X+Y+Z) \leq 1.0$.

15 Claims, 1 Drawing Sheet

SEMICONDUCTOR DEVICE AND SOLAR CELL

BACKGROUND OF THE INVENTION

1. Field of the Invention

The present invention relates to a semiconductor device and a solar cell having a novel compound semiconductor layer as a window layer on a substrate.

2. Description of the Related Art

Recently, photo-semiconductor devices are aggressively studied. One important subject of studies in the conversion of photon to electricity is high efficiency of charge generation in the active domain inside a semiconductor device. An indispensable condition for achieving a higher efficiency is effective incidence of light used for photo-electro-conversion into the active domain. Semiconductor devices using a normal semiconductor bonding technique are formed from semiconductors having sensitivity within a range of visible light, so that the light in short wavelengths in which the absorption coefficient is relatively large may have difficulties in penetrating into the active layer, resulting in no contribution to the charge generation. This is a cause of decrease of sensitivity in shorter wavelength light.

In the semiconductor forming a depletion layer, the incident side of the depletion layer is preferably transparent. The best windowing material proposed at the time of writing is a-SiCx. However, a-SiCx has characteristics that the transmittance of visible light may be larger with increase of C component, while on the other hand the photo-electroconductivity and charge transportability will be abruptly decreased at or over 2.0 eV of the optical gap (approximately 620 nm). This may cause another problem of failure in effective use of lights well within a range of short wavelengths. In addition, there have been some cases where transparent metal oxides were used for the windowing layer; these attempts were aimed at adding transparent electrodes. The semiconductor layer forming the active domain was formed of a certain combination of materials in which the visible light was absorbed, the decreased sensitivity in shorter wavelengths caused by the semiconductor layers beneath the window layer still remains in these configurations, causing another problem.

Furthermore, in the conversion of photon energy to electric energy by using a semiconductor device, the photon energy larger than the optical gap will be used for energy of lattice vibration, hence a loss. It is preferable to match the irradiated light wavelength with the optical gap. A laminated structure of semiconductors having different optical gaps is being considered. However, there is no semiconductor that can be used in the shorter wavelengths for a semiconductor device requiring a larger surface area. Wavelengths shorter than 500 nm have the strongest radiation energy of the sun, however the loss of photon energy is considerable along with the decreased efficiency of incident light as have been described above, this may pose another problem.

In recent years compound semiconductors of nitride are in focus as wide band gap semiconductors usable in shorter wavelengths. Although these semiconductors have been applied to, for example, light emitting devices and ultraviolet sensors, these semiconductors are made of single crystalline film sintered at a very high temperature of approximately 1000° C. with the aid of sapphire substrate, and are not usable as an option of semiconductor devices such as solar cells, due to their manufacturing cost and attainable surface area. In addition, these nitride compound semiconductor crystals incorporate GaN or AlN or ZnO buffer layer at the interface to the substrate, an additional semiconductor bonding to another semiconductor material for operating as a semiconductor device such as solar cells may not be possible.

On the other hand, concern over the greenhouse effect caused by the fact that the carbon dioxide emission to the atmosphere is increasing is imposing a considerably strong demand of cleanliness of energy sources. The solar cells are the most favorable candidate of energy sources that may make use of inexhaustible solar energy. Solar cells have been realized, using crystalline or amorphous silicon solar cells, semiconductors solar cells of III–V family compounds including GaAs and InP. In order to contribute to the cleanability of whole energy sources, the power should be supplied from as many solar cells as possible. To do this, the most important issue is the improvement of conversion efficiency of the solar cells.

As have been described above, the theoretical efficiency of conversion from photon energy to electrical energy may be defined by the optical gap of the semiconductor used. This implies that, of light energy of a wavelength incident to a solar cell, the energy exceeding the optical gap will be wasted as a loss due to the lattice vibration and the like. Thus the shorter the wavelength is, the more the rate of energy loss increases. Although the component ratio of the spectra included in the sunlight may be different on the surface from the outer space, the peak radiation energy resides in either case at approximately 400 to 600 nm (equivalently 3.5 to 2.5 eV of optical gap). The optical gap of crystalline silicon is 1.1 eV, while GaAs 1.4 eV, corresponding to 1100 nm and 886 nm, respectively. These materials may be capable of convert infrared light to the electricity, however such semiconductors have larger energy loss at the peak wavelength band of solar radiation energy.

In addition, the wavelength dependency in the sensitivity of optical semiconductors is in reality to be considered as a factor affecting the theoretical efficiency. In general, the sensitivity may be decreased in shorter wavelengths; the energy loss in this band will be larger. GaAs has a larger optical gap compared to crystalline silicon, thus the theoretical efficiency of conversion is relatively as high as 30%. However since the manufacturing cost of GaAs substrate is 30 times or more higher than that of Si substrates and the size of monocrystalline substrate is limited, vast application thereof may not be potentially promised. GaAs is a direct transition semiconductor, which has strong absorption, so that a thin layer may be sufficient for a generator device. For this reason, an attempt to form GaAs on a low-cost Si substrate is in progress. When considering the conversion efficiency, Si and GaAs are close in the optical gap; the absorption characteristics of both semiconductors may not be well developed. Also there is another problem that the hetero growth thereof is difficult.

Another attempt is performed to improve the usable efficiency of solar energy by forming a tandem structure. In order to provide a tandem structure one active domain having a diode configuration have to be formed adjacent to another active domain having a diode configuration. In addition to this, the holes and electrons must disappear by recombination at the interface. This means that a barrier must be formed with adjoining layers having different conduction types at the interface, so that the different density and type of elements should be deposited abruptly at the growing interface for the control of conduction type. So far the crystal growth at a high temperature has not been successful for developing a sufficiently precipitous interface. Therefore the solar energy was not sufficiently available.

Amorphous silicon hydride has a large optical gap in comparison with a crystalline Si and GaAs, is relatively close to the solar energy spectra in the visible light. However it has an absorption rate in the incident side larger than that of the crystalline silicon, lower theoretical conversion rate in the range between approximately 400 and 500 nm as well as absorption loss, while on the other hand it cannot absorb the infrared lights that are predominant in the solar radiation energy.

The amorphous silicon hydride has indeed, in addition to its limitation in theoretical efficiency, an optical retrogradation effect that lowers the optical-electro conversion rate when irradiating thereto a strong light. The conversion rate obtained by a solar radiation at a sufficient and practical level is around 10%.

SUMMARY OF THE INVENTION

The present invention has been made in view of the above circumstances and provides a semiconductor device and a solar cell, which may be low-cost, highly efficient, safe, and last long.

The present invention provides:

<1> A semiconductor device that includes a semiconductor layer, deposited as a window layer on a semiconductor layer, the window layer containing a compound semiconductor of a nitride compound composed of nitrogen element and one or more elements selected from the group consisting of Al, Ga, and In.

<2> A semiconductor device according to <1>, wherein the window layer contains hydrogen and/or halogen elements at 0.1 to 40 atom %.

<3> A semiconductor device according to <1>, wherein the semiconductor layer having p-type conductivity; and the window layer contains one or more elements selected from a group of C, Si, Ge and Sn.

<4> A semiconductor device according to <1>, wherein the semiconductor layer having n-type conductivity; and the window layer contains one or more elements selected from the group consisting of Be, Mg, Ca, Zn and Sr.

<5> A semiconductor device according to<1>, wherein the semiconductor layer is made of silicon.

<6> A semiconductor device according to <5>, wherein the silicon is the silicon selected from the group consisting of crystalline silicon, polycrystalline silicon, microcrystalline silicon, or amorphous silicon.

<7> A semiconductor device according to <1>, wherein the semiconductor layer is made of one or more elements selected from the group consisting of IIIA family elements in the periodic table and P and/or As.

<8> A semiconductor device according to <1>, wherein the semiconductor layer is made of a chalcopyrite compound including Cu.

<9> A semiconductor device according to <1>, further comprising an intermediate layer including In element provided between the semiconductor layer and the window layer.

<10> A semiconductor device according to <9>, wherein the intermediate layer having plural layers each having a different concentration of In element.

<11> A semiconductor device according to <10>, wherein the In element concentration in the plural layers are gradually decreased toward the direction of incident light.

<12> A semiconductor device according to <9>, wherein the compound semiconductor layer and the intermediate layer contain one or more elements selected from the group consisting of C, Si, Ge and Sn; and the concentration of the elements contained in the intermediate layer is lower than the concentration of the elements contained in the window layer.

<13> A semiconductor device according to <9>, wherein the window layer and intermediate layer contain one or more elements selected from the group consisting of Be, Mg, Ca, Zn and Sr; and the concentration of the elements contained in the intermediate layer is lower than the concentration of the elements contained in the window layer.

<14> A semiconductor device according to claim <9> wherein the window layer and intermediate layer are formed at 600° C. or lower.

<15> A solar cell, comprising: a compound semiconductor layer containing a nitride compound semiconductor expressed by a composition $Al_X Ga_Y In_Z N_W$ on a semiconductor layer; wherein the X, Y, Z and W represent a composition ratio, and wherein the X, Y, Z and W satisfy $$0.8 \leq (X+Y+Z)/W \leq 1.2 \text{ and } 0.1 \leq Z/((X+Y+Z) \leq 1.0.$$

<16> A solar cell, comprising: a substrate; a compound semiconductor layer containing a nitride compound semiconductor expressed by a composition $Al_{X1} Ga_{Y1} In_{Z1} N_{W1}$ on the substrate; a compound semiconductor layer containing a nitride compound semiconductor expressed by a composition $Al_{X2} Ga_{Y2} In_{Z2} N_{W2}$ on the compound semiconductor layer; wherein the X1, Y1, Z1 represent a composition ratio, satisfying the following expression: $0.6 \leq Z1/(X1+Y1+Z1) \leq 1.0$; wherein the X2, Y2, Z2 represent a composition ratio, satisfying the following expression: $0 \leq Z2/(X2+Y2+Z2) \leq 0.9$; and wherein Z1 and Z2 are in the condition $Z2 \leq Z1$.

Additional features, advantages of the invention will be according to part in the description which follows and in part will be obvious from the description, or may be learned by practice of the invention. The advantages of the invention may be implemented and attained by means of the instrumentalities and combinations particularly pointed out in the appended claims.

BRIEF DESCRIPTION OF THE DRAWING

The following description of preferred embodiments of the present invention may be best understood by reading carefully with reference to the accompanying drawing, in which.

DETAILED DESCRIPTION OF THE PREFERRED EMBODIMENTS

Figure 1:
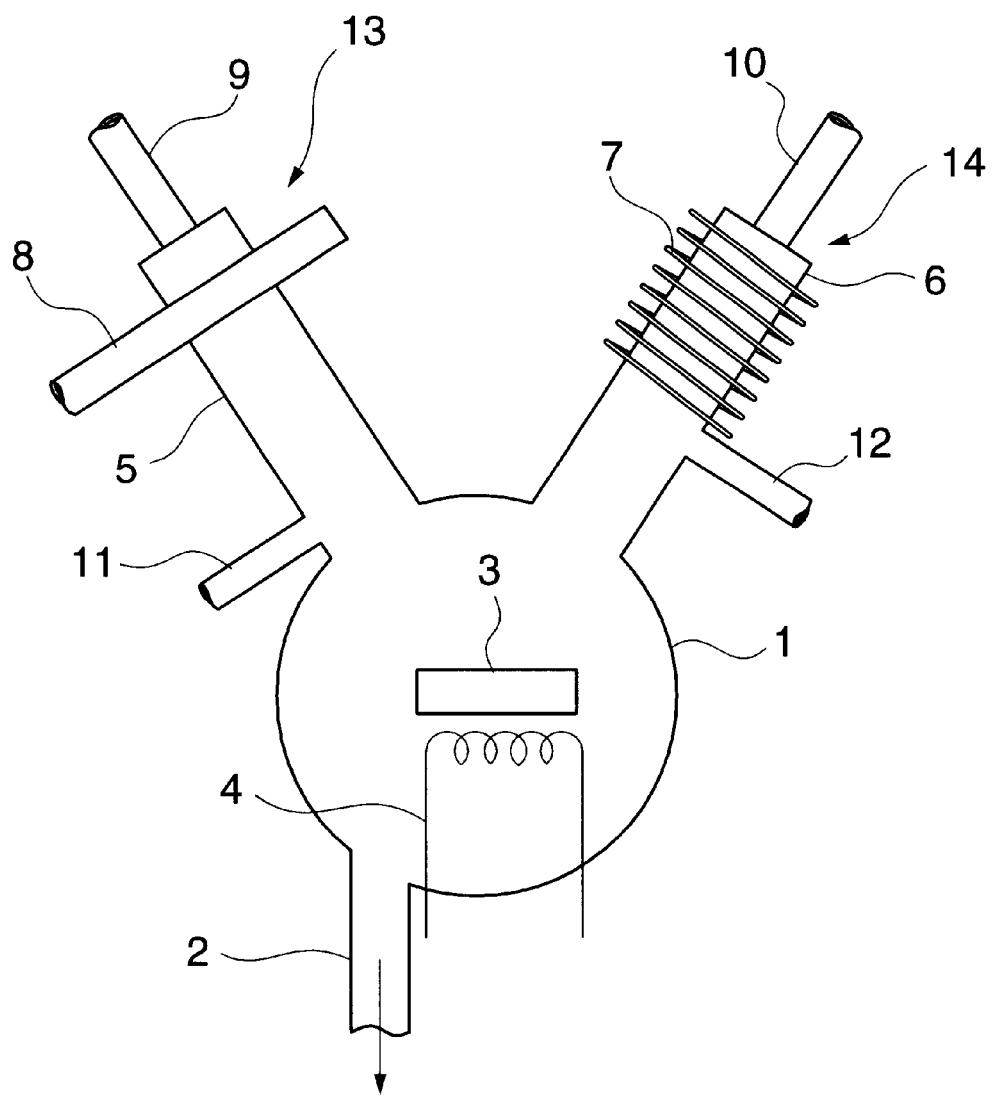
FIG. 1 is a schematic diagram of a representative example of the apparatus for producing a semiconductor device and a solar cell in accordance with the present invention.

A detailed description of preferred embodiments embodying the present invention will now be given referring to the accompanying drawings.

[Semiconductor Device]

The semiconductor device in accordance with the present invention includes at least a compound semiconductor layer on a semiconductor substrate, and other layers and electrodes where appropriate.

(Semiconductor Substrate)

The substrate in accordance with the present invention is not limitative, provided that it is semiconductor. Some preferable examples of substrates red include, among others, silicon substrate, substrate containing one or more elements selected from a group of IIIA family elements in the periodic table and P and/or As, as well as substrate made of chalcopyrite including Cu. These materials may be of either p-type or n-type conductivity.

Some examples of the silicon substrates as have been described above may include crystalline silicon, polycrystalline silicon, microcrystalline silicon, amorphous silicon and so forth.

Some examples of the substrate containing one or more elements selected from a group of IIIA family elements in the periodic table and P and/or As may include GaAs, GaAlAs, GaAlP, GaP, AlGaP, InP, InGap, InAlP and so forth. The light absorption in the short wavelength range may be used considerably at a higher efficiency to approach the theoretical efficiency rate.

Some examples of the substrate made of chalcopyrite including Cu may include, for example, p-type chalcopyrite compound semiconductors such as $CuInSe_2$, $CuInS_2$, $CuGaSe_2$, and $CuInGaSe_2$.

In addition, some compound semiconductors of II–VI families such as CdS, CdSe, and CdTe may also be used.

(Compound Semiconductor Layer)

The compound semiconductor layer contains compound semiconductor of nitride, and some other components as appropriate.

The nitride compound semiconductor may include one or more elements selected from a group of Al, Ga and In (these three elements will be also referred to as 'IIIA family elements' hereinbelow) and nitrogen, as well as other components as appropriate.

The compound semiconductor layer is served for a window layer. The term window layer is a layer on which a semiconductor bonding may be formed with respect to the semiconductor substrate, or with respect to an intermediate layer if the intermediate layer is formed on the semiconductor substrate. Also the window layer is characterized by the permeability of lights of a wavelength shorter than the very end of the long wavelength side of optical absorption by the semiconductor substrate or by the intermediate layer. The transmittance of light of shorter wavelength may obtain a semiconductor device of higher efficiency. The window layer may also be served as a converter from the light absorbed therein to the electricity.

Some elements for the control of conductivity may be doped to the compound semiconductor layer. The detailed description of doping is similar to that of the solar cell of the present invention, and will be described later.

For a p-type semiconductor substrate, preferably one or more of elements selected from a group of C, Si, Ge and Sn, which represent n-type conductivity, may be impregnated to the compound semiconductor layer. For an n-type semiconductor substrate, also preferably one or more elements selected from a group of Be, Mg, Ca, Zn and Sr, which represent p-type conductivity, may be impregnated to the compound semiconductor layer.

A semiconductor bonding may be formed thereby between a crystalline or microcrystalline compound semiconductor layer and either p-type or n-type semiconductor substrate. This junction can generate photo-electromotive force. The compound semiconductor layer is a wider band gap semiconductor in comparison with the underneath semiconductor substrate. For the purpose of transmittance of light of short wavelengths to the active domain in the semiconductor junction at higher efficiency, the compound semiconductor layer, which is made of a nitride compound of Al and/or Ga and nitrogen, may include In in addition to Al and Ga. The composition rate of In with respect to the total composition rate of IIIA family elements may be in the range of $0<In/(Al+Ga+In)<0.1$.

As can be seen from the foregoing discussion, a junction with different optical gaps formed at the interface of semiconductor substrate and compound semiconductor layer may define a larger internal electric field to enable the wider wavelengths of light from ultraviolet to infrared to be penetrated through the interface of semiconductor substrate to the active domain after passing through the window of nitride compound semiconductor, to finally improve the conversion rate. Also, between a p-type semiconductor substrate and an n-type compound semiconductor layer an i-type semiconductor substrate or an i-type compound semiconductor layer may be provided as an intermediate conductivity.

For example, for a p-type silicon substrate, n-type $Al_{X1} Ga_{Y1} N/n^+$-type $Al_{X2} Ga_{Y2} N$, i-type $Al_{X1} Ga_{Y1} N$/n-type $Al_{X2} Ga_{Y2} N$, n-type $Ga_{Y1} N/n^+$-type $Ga_{Y2} N$, n-type $Ga_{Y1} In_{Z1} N/n^+$-type $Al_{X2} Ga_{Y2} N$, and the like (where x, y, z represent a composition ratio) maybe selectable, and may improve the difference between Fermi energy and conduction band energy. Also for example, for an n-type silicon substrate, i-type $Ga_{Y1} In_{Z1} N$/p-type $Ga_{Y2} In_{Z2} N$, p-type $Ga_{Y1} In_{Z1} N/p^+$-type $Ga_{Y2} In_{Z2} N$, p-type $Ga_{Y1} In_{Z1} N$/p-type $Ga_{Y2} N$, p-type $Ga_{Y1} In_{Z1} N/p^+$-type $Al_{X2} Ga_{Y2} N$, and the like is selectable. Accordingly, charges generated inside may be smoothly separated and taken out in spite of a tandem structure, without any barrier at respective active domain interface, without any losses, and with the internal field generated toward only one direction.

Similarly the structure almost same as have been described above may be possible for micro-crystalline silicon, polycrystalline silicon, amorphous silicon, GaAs, GaP, chalcopyrite and the like.

The compound semiconductor layer may contain 0.1 to 40 atom % of hydrogen and/or halogen elements. The nitrogen compound semiconductor on the semiconductor substrate maybe either of single crystalline, amorphous, microcrystalline, or polycrystalline, however the inactivation of compound semiconductor layer by using hydrogen or halogen elements will be required, because the amorphous semiconductors has many bonding defects, microcrystalline and polycrystalline semiconductors have bonding defects, dislocation defects, and defects of crystalline grain boundaries. In order to impregnate hydrogen and halogens into the compound semiconductor layer, preferably the process including deposition and post operations is performed at a low temperature of 600° C. or lower.

Hydrogen and Halogens will perform an electric compensation when taken into the bonding defects or grain boundary defects within a crystal to dissipate the development of optical carriers, the diffusion of carriers, and traps with respect to dislocation and to indicate an excellent photoelectric characteristics. The amount of hydrogen may be measured by a hydrogen forward scattering (HFS) method as the absolute value, or may be estimated by means of infrared optical densitometry.

The nitride compound semiconductor may be of either amorphous, micro-crystalline, or polycrystalline one. The crystal may be cubic, or may include both or either of cubic and hexagonal systems. The orientation may be plural, however one single orientation is preferable. The growth cross-section may represent either columnar structure or smooth monocrystal.

The term single crystal herein encompasses a crystal having primarily punctiform bright spots in a transmission electron microscopic diffractometry pattern or reflection electron diffraction, with no ring-shaped diffractive patterns, as well as almost spotted pattern, spotted pattern, and streak pattern, and having one single orientation of approximately 80% or more of entire strength in an X-ray diffractometry.
(Other Layers)

The output conversion of light in the semiconductor device in accordance with the present invention may be performed in the depletion layer of semiconductor junction on the window layer side and in the semiconductor substrate beneath the window layer on the depletion layer side. The light of wavelength shorter than 500 nm that is the strongest component of the sunlight may penetrate into the depletion layer. The photocurrent conversion increases the photocurrent (Isc) if the amount of light available increases. On the other hand, in the viewpoint of energy conversion rate of semiconductor device, photoabsorption in the depletion layer of a semiconductor of small optical gap may aggravate the loss of output conversion in the shorter wavelengths. In order to perform effective energy conversion, a window layer is required which may define a depletion layer having an optical gap corresponding to the wavelength of incident light. To do this an intermediate layer having an In density higher than the topmost window layer may be provided. The intermediate layer may be single or plural, may convert effectively the optical energy of short wavelength into electric energy by decreasing In density gradually toward the window layer from which the light is incident.

For the p-type semiconductor substrate, the amount of doping of one or more elements representative of n-type conductivity selected from a group of C, Si, Ge and Sn to the crystalline or microcrystalline compound semiconductor layer and intermediate layer to alter the Fermi energy together with the change of optical gap to prevent a barrier from developing continuously in the conductive band and charged electron band.

For the n-type semiconductor substrate, the amount of doping of one or more elements representative of p-type conductivity selected from a group of Be, Mg, Ca, Zn and Sr to the crystalline or microcrystalline compound semiconductor layer and intermediate layer to alter the Fermi energy together with the change of optical gap to prevent a barrier from developing continuously in the conductive band and charged electron band.

To achieve this, one or more elements selected from a group of C, Si, Ge and Sn to be doped into the intermediate layer, or one or more elements selected from a group of Be, Mg, Ca, Zn and Sr are to be at a lower density than the density of these elements included in the compound semiconductor layer, in other words the density of these elements may be gradually increased toward the direction of incident light.

The semiconductor device in accordance with the present invention may be produced in a manner similar to the production method of solar cell described later. The compound semiconductor layer and intermediate layer in the semiconductor device in accordance with the present invention are preferably produced at 600° C. or lower.

The semiconductor device structure in accordance with the present invention is excellent in light-, heat-, acid-resistance, higher quantum effect in a broader range of wavelengths, higher power of generation per weight, and, in addition to solar cell and optical sensors as optical generator device, may be applied as optical generator device in such fields as photodiodes, image sensors, positional sensors, transistors, thin film transistors. Furthermore, the semiconductor device in accordance with the present invention may integrate a solar cell, a photodiode, and a transistor on one single semiconductor substrate.

[Solar cell]
[First Embodiment]

The solar cell in accordance with first preferred embodiment of the present invention may incorporate a single layer of compound semiconductor layer on a semiconductor substrate, and the electrodes and the like if necessary.
(Semiconductor Substrate)

The semiconductor substrate for the solar cell in accordance with the first embodiment is not limitative, provided if it is semiconductor. More specifically, a substrate made of crystalline silicon is preferable. Some examples of crystalline silicon may include microcrystalline silicon, polycrystalline silicon. Also a crystalline silicon substrate may be formed by depositing a thin film of crystalline silicon on an isolation layer made of glass or $SiO_2$.

The crystalline silicon substrate may be any of p-, n-, pn-, np-type. The orientation of silicon crystal may be (100), (110) or (111) and so forth.

Silicon is an indirect transition semiconductor, which requires a thick substrate for absorbing sufficient amount of light due to low absorbance of silicon. The thickness of crystalline silicon substrate may range in general from approximately 40 $\mu$m to 1 mm; the conversion rate in long wavelength may be decreased if the substrate is not enough thick.

The optical gap of crystalline silicon is 1.1 eV, corresponding to 1100 nm of absorbance. The photoelectric conversion rate is lower in the wavelengths of visible light, and may go to 50–30% at the wavelength, the strongest range of the sunlight of blue, green, and yellow. To improve the efficiency of solar cell having such characteristics, a lamination of optical conductors having a band edge at a shorter wavelength will be necessary so as to reduce the lossy part.
(Compound Semiconductor Layer)

In the solar cell in accordance with the first preferred embodiment of the present invention, the compound semiconductor layer is formed as a single layer structure.

The solar cell in accordance with the present invention includes: a semiconductor substrate and a compound semiconductor layer including a nitride compound semiconductor defined by a composition formula $Al_X Ga_Y In_Z N_W$, wherein the X, Y, Z and W represent a composition ratio, and wherein the X, Y, Z and W satisfy $$0.8 \leq (X+Y+Z)/W \leq 1.2 \text{ and } 0.1 \leq Z/(X+Y+Z) \leq 1.0.$$

The compound semiconductor layer includes a compound semiconductor of nitride represented by a formula $Al_X Ga_Y In_Z N_w$, the total composition ratio of Al, Ga and In with respect to the composition ratio of N (nitrogen), i.e., (x+y+z)/w is necessarily in the range between 0.8 and 1.2, preferably in the range between 0.9 and 1.1. The value of (x+y+z)/w of less than 0.8 or more than 1.2 may cause bonding defects and dangling bonds, and then decrease of photoconductivity.

The nitride compound semiconductor included in the compound semiconductor layer has necessarily the composition ratio of In with respect to the total composition rate of IIIA family elements, i.e., z/(x+y+z) in the range between 0.1 and 1.0, preferably in the range between 0.15 and 0.9. The value of z/(x+y+z) of less than 0.1 causes the semiconductor to be transparent for the visible light, to decrease the improvement of conversion rate. In order to satisfy the above expression, the nitride compound semiconductor requires In, but may or may not include Al and Ga.

In accordance with the present invention, it is indispensable to use a photoconductor of wider band gap as the material of window in the incident side, so as to allow more light to be reached into the active domain of optical generation. Thus the nitride compound semiconductor is required. In particular, it is important to have a wide band gap nitride compound semiconductor including In to the shorter wavelengths. For example, the optical gap of InN is 1.9 eV, corresponding to 650 nm. In case of InN, the size of optical gap is smaller with respect to the wavelength of 2.6 eV of the maximum radiation intensity of sunlight, thus makes 27% of loss, a larger photoconductive loss of absorbed sunlight.

In order to convert effectively the visible light among the sunlight to the electric power, a nitride compound semiconductor having an optical gap larger than InN is effective. The nitride compound semiconductor defined by the present invention may be used.

[Second Embodiment]

A solar cell in accordance with second preferred embodiment of the present invention incorporates at least two layers or more of compound semiconductor layer on a substrate, and electrodes and the like as required.

(Substrate)

The substrate for the solar cell in accordance with the second embodiment is not limitative, any substrate known in the art used for the solar cell substrate may be used. More specifically, the substrate of crystalline silicon is preferable in the viewpoint of usage of infrared and visible light of longer wavelengths, similarly to the substrate for the solar cell in accordance with the first embodiment.

(Compound Semiconductor Layer)

A solar cell in accordance with the present invention includes a substrate, a first compound semiconductor layer containing a nitride compound semiconductor expressed by a composition $Al_{X1} Ga_{Y1} In_{Z1} N_{W1}$ thereon, and a second compound semiconductor layer containing a nitride compound semiconductor expressed by a composition $Al_{X2} Ga_{Y2} In_{Z2} N_{W2}$ thereon, wherein the layers are deposited in this order, wherein the X1, Y1, Z1 represent a composition ratio, satisfying the following expression: $0.6 \leq Z1/(X1+Y1+Z1) \leq 1.0$, wherein the X2, Y2, Z2 represent a composition ratio, satisfying the following expression: $0 \leq Z2/(X2+Y2+Z2) \leq 0.9$, wherein Z1 and Z2 are in the condition $Z2 \leq Z1$.

The first compound semiconductor layer may be provided close to the substrate, while the second compound semiconductor layer may be provided on the first compound semiconductor layer, apart from the substrate, namely, close to the incident light.

The first compound semiconductor layer may contain a nitride compound semiconductor representative of $Al_{X1} Ga_{Y1} In_{Z1} N_{W1}$, in which the composition ratio of In with respect to the total composition ratio of IIIA family elements, i.e., the value of $Z1/(X1+Y1+Z1)$ must be necessarily in the range between 0.6 and 1.0, more preferably in the range between 0.7 and 0.9. The value of $Z1/(X1+Y1+Z1)$ of less than 0.6 may cause a larger optical gap, hence larger loss of photoelectric conversion. In order to satisfy the above expression, the nitride compound semiconductor must contain In but may or may not contain Al and Ga.

The second compound semiconductor layer may contain a nitride compound semiconductor representative of $Al_{X2} Ga_{Y2} In_{Z2} N_{W2}$, in which the composition ratio of In with respect to the total composition ratio of IIIA family elements, i.e., the value of $Z2/(X2+Y2+Z2)$ must be necessarily in the range between 0 and 0.9, more preferably in the range between 0 and 0.8. The value of $Z2/(X2+Y2+Z2)$ of more than 0.9 may eliminate the difference of optical gap from the first compound semiconductor layer, hence become less effective. The nitride compound semiconductor contained in the second compound semiconductor layer need not necessarily contain In, unlike the nitride compound semiconductor contained in the first compound semiconductor layer.

The composition ratio of In (Z1) of the nitride compound semiconductor contained in the first compound semiconductor layer and the composition ratio of In (Z2) of the nitride compound semiconductor contained in the second compound semiconductor layer are required to satisfy a relation $Z2 \leq Z1$. If $Z2 > Z1$, then the light transmittance into lower layers will be decreased and the loss of photoelectric conversion will be increased.

When one layer of compound semiconductor layer is formed on a silicon substrate, a domain that cannot absorb or has a larger loss in the broader wavelengths of visible light of 400 to 600 nm may be developed so as to increase the non-converted rate of entire radiation to the electricity. Two or more compound semiconductor layers are more preferable as is recommended by the present invention. In such a case, the compound semiconductor layers should be deposited, layer-by-layer, such that the optical gap at the side of incident sunlight becomes relatively and gradually larger in order to maximize the conversion rate. The solar cell in accordance with the present invention has the second compound semiconductor layer deposited on the first compound semiconductor layer to effectively minimize the domain that may absorb but not convert light to electricity.

In the solar cells in accordance with first and second preferred embodiments of the present invention, the composition of compound semiconductor layer may be measured by means of such instruments as X-lay photospectrometer, Auger spectroscope, electron-microprobe, Rutherford back scattering (RBS), secondary ion mass spectroscope, and the like. It should be noted here that when analyzing while etching in the depth direction at the same time, care should be taken to consider the results since the etching rate of IIIA family elements is different from that of nitrogen. A preferable measuring method may be Rutherford back scattering.

The compound semiconductor layer in the solar cell in accordance with first and second preferred embodiments of the present invention may include hydrogen less than 50 atom %. A trace of hydrogen may be taken into the bonding defects in the crystal to perform electrical compensation at the lower temperature. This may improve the photoelectric characteristics among others. The amount of hydrogen may be measured by the hydrogen forward scattering (HFS) as the absolute amount, otherwise may be estimated by the infrared absorption spectrometry.

The nitride compound semiconductor contained in the compound semiconductor layer in accordance with first and second preferred embodiments of the present invention may be any of amorphous, microcrystalline, and polycrystalline. If the nitride compound semiconductor is crystalline, the crystal should be substantially either one of cubic or hexagonal system, preferably having one single orientation. Furthermore, the growth cross-section may be columnar structure or smooth single crystal.

The term single crystal of nitride compound semiconductor encompasses a crystal having primarily punctiform bright spots in a transmission electron microscopic diffractometry pattern or reflection diffraction, with no ring-shaped diffractive patterns, as well as almost spotted pattern, spotted pattern, and streak pattern, and having one single orientation of approximately 80% or more of entire strength in an X-ray diffractometry.

In the solar cell in accordance with first and second preferred embodiments of the present invention, when defining a compound semiconductor layer directly on the substrate, it is preferable to form a semiconductor junction between the layer and the substrate. More specifically, the conductivity of the substrate may be preferably different from the conductive type of compound semiconductor layer adjacent to the substrate. For example, a p-type compound semiconductor layer on an n-type substrate, or an n-type compound semiconductor layer on a p-type substrate may be preferable. In such a manner, a junction is formed which is different in optical gaps at the interface of substrate with the compound semiconductor layer, generating a larger internal field to improve the conversion rate in a broader wavelength band. Also in the solar cell in accordance with second preferred embodiment, for example, an i-type substrate or an i-type compound semiconductor layer as an intermediate conductivity may be provided between the p-type substrate and the n-type compound semiconductor layer.

Furthermore in the solar cell in accordance with second preferred embodiment, when the substrate has a semiconductor junction, a compound semiconductor layer having a semiconductor junction may be provided thereon. For example, a compound semiconductor layer having a pn-junction for a pn-type substrate, and a compound semiconductor layer having an np-junction for an np-type substrate may be deposited. On this first compound semiconductor layer having a junction deposited on the substrate, a second compound semiconductor layer may be deposited which has a semiconductor junction of lower In density. Otherwise, between the first and second compound semiconductor layers, another compound semiconductor layer having an In density in-between.

When providing compound semiconductor layers of different absorbance, a tunnel junction may be defined at the interfacial junction thereof to smoothly neutralize the charges at the tunnel junction. The tunnel junction must be produced by a very steep doping profile. Preferably very quick switching of doping gas at the interface is performed followed by the deposition at a lower temperature for diffusion after deposition.

If the tunnel junction is not completely perfect, there will be a barrier between the compound semiconductor layers. In this case, for the optical gap to gradually increase toward the superficial side (of incident light), layers may be provided so as to reduce the difference between the Fermi energy and conductive band energy. More specifically, immediately on top of substrate, a compound semiconductor layer of the conductivity different from that of the substrate may be formed, and then another compound semiconductor layer may be arranged thereon so as to widen the optical gap at the side of incidence, and to either decrease or increase sequentially the density of elements controlling the conductivity. It may be possible to change the conductivity controlling element.

For example, for a p-type substrate, n-type $Ga_{Y1} In_{Z1}$ N/n$^+$-type $Ga_{Y2} In_{Z2}$ N, i-type $Ga_{Y1} In_{Z1}$ N/n-type $Ga_{Y2} In_{Z2}$ N, n-type $Ga_{Y1} In_{Z1}$ N/n$^+$-type $Ga_{Y2}$ N, n-type $Ga_{Y1} In_{Z1}$ N/n$^+$-type $Al_{X2} Ga_{Y2}$ N are selectable and may increase the difference between the Fermi energy and conductive band energy.

Also for a n-type substrate, i-type $Ga_{Y1} In_{Z1}$ N/p-type $Ga_{Y2} In_{Z2}$ N, p-type $Ga_{Y1} In_{Z1}$ N/p$^+$-type $Ga_{Y2} In_{Z2}$ N, p-type $Ga_{Y1} In_{Z1}$ N/P-type $Ga_{Y2}$ N, p-type $Ga_{Y1} In_{Z1}$ N/p$^+$-type $Al_{X2} Ga_{Y2}$ N are selectable, and charges generated inside may be smoothly separated and taken out in spite of a tandem structure, without any barrier at respective active domain interface, without any losses, and with the internal field generated toward one direction.

In the solar cell in accordance with first and second preferred embodiments, conduction controllable elements may be doped into the compound semiconductor layer. Doping gas may be introduced either separately or may be mixed with organic metal compound containing IIIA family elements. Or, doping gas may be introduced at the same time with the organic metal compound or sequentially.

Elements selectable for n-type dope may include Li of IA (family number of inorganic chemical nomenclature revised edition 1989 by IUPAC is 1), Cu, Ag and Au of IB (family number of inorganic chemical nomenclature revised edition 1989 by IUPAC is 11), Mg of IIA (family number of inorganic chemical nomenclature revised edition 1989 by IUPAC is 2), Zn of IIB (family number of inorganic chemical nomenclature revised edition 1989 by IUPAC is 12), C, Si, Ge, Sn and Pb of IVA (family number of inorganic chemical nomenclature revised edition 1989 by IUPAC is 14), and S, Se, and Te of VIA (family number of inorganic chemical nomenclature revised edition 1989 by IUPAC is 16). C, Si, Ge, Sn are preferable in the viewpoint of charge-carrier controllability.

Elements selectable for p-type dope may include Li, Na and K of IA, Cu, Ag and Au of IB, Be, Mg, Ca, Sr, Ba and Ra of IIA, Zn, Cd and Hg of IIB, C, Si, Ge, Sn and Pb of IVA, S, Se and Te of VIA (family number of inorganic chemical nomenclature revised edition 1989 by IUPAC is 16), Cr, Mo and W of VIB (family number of inorganic chemical nomenclature revised edition 1989 by IUPAC is 6), Fe (family number of inorganic chemical nomenclature revised edition 1989 by IUPAC is 8), Co (family number of inorganic chemical nomenclature revised edition 1989 by IUPAC is 9), Ni (family number of inorganic chemical nomenclature revised edition 1989 by IUPAC is 10) of VIII family. Be, Mg, Ca, Zn and Sr are preferable in the viewpoint of charge-carrier controllability.

For i-type, the same elements as p-type may be used but at much lower density.

The hydrogen residing in the layer must be treated so as not to bind and inactivate dopant. In the viewpoint of selectable combination of the hydrogen for passivation of defect level to IIIA family elements and nitrogen rather than dopant, preferable elements selectable for n-type may include in particular C, Si, Ge and Sn, and preferable elements selectable for p-type may include in particular Be, Mg, Ca, Zn and Sr, and preferable elements selectable for i-type may include in particular Be, Mg, Ca, Zn and Sr.

Elements selectable for doping may include, $SiH_4$, $Si_2H_6$, $GeH_4$, $GeF_4$, and $SnH_4$, for n-type doping, $BeH_2$, $BeCl_2$, $BeCl_4$, cyclopentadienyl magnesium, dimethyl calcium, dimethyl strontium, dimethyl zinc, diethyl zinc and the like for p-type doping, the compounds identical to p-type doping for i-type doping, all in a gas phase. Doping elements may be diffused into the layer as-is, or may be doped as ions.

Method of Producing a Solar Cell

A method of producing a solar cell in accordance with the present invention will be described below in greater details with reference to accompanying drawing.

Now referring to FIG. 1, there is shown a schematic diagram of an apparatus for producing a solar cell in accordance with the present invention. This apparatus may produce a suitable compound semiconductor layer on a substrate. The solar cell producing apparatus includes a reactor 1 in a columnar form, first and second activator-feeder 13 and 14, which are connected with the reactor 1 through a top opening, an exhaust tube 2 for exhausting gas in the reactor 1, which is connected with the reactor I through a bottom opening, a substrate holder 3 mounted in the reactor 1 for supporting a substrate, and a heater 4 disposed in an opposite side of the substrate holder 3.

The first and second activator-feeder 13 and 14 includes cylindrical quartz tube 5 and 6 which are communicated with the reactor 1 and disposed radially outside of the reactor 1, gas introducing tube 9 and 10, which are communicated to the reactor 1 at the opposite side of cylindrical quartz tube 5 and 6.

The first activator-feeder 13 includes a microwave waveguide 8 disposed so as to intersect the cylindrical quartz tube 5, a gas introducing tube 11 connected to the cylindrical quartz tube 5 at a position near the reactor 1 from the intersection of the cylindrical quartz tube 5 and the microwave waveguide 8. The microwave waveguide 8 is in a form of housing through which the cylindrical quartz tube 5 is passing.

The second activator-feeder 14 uses a high frequency coil 7 instead of microwave discharge tube 8. The high frequency coil 7 is wound around the outer surface of the cylindrical quartz tube 6 and connected to a high frequency oscillator not shown in the figure.

Each of gas introducing tube 9, 10, 11 and 12 of the first and second activator-feeder 13 and 14 are respectively connected to a gas cylinder as a feeder unit that supplies raw gas, not shown in the figure.

A mass flow controller (not shown) for supplying intermittently raw gas is connected to the gas introducing tubes 11 and 12. The microwave waveguide 8 is connected to a microwave oscillator using a magnetron not shown so as to discharge in the cylindrical quartz tube 5. The exhaust tube 2 is connected to a vacuum pump as an exhaust unit not shown in the figure to exhaust the interior of reactor 1 to a suitable vacuum.

In this configuration, $N_2$ gas, a nitrogen feeder, may be introduced through the gas introducing tube 9 into the cylindrical quartz tube 5. Microwaves will be supplied to the microwave waveguide 8 connected to a microwave oscillator (not shown) using a magnetron, to generate discharges within the cylindrical quartz tube 5. From another gas introducing tube 10 $H_2$ for example may be introduced into the cylindrical quartz tube 6. A high frequency oscillator (not shown) may generate and supply a high frequency to the high frequency coil 7 to promote the discharge in the cylindrical quartz tube 6. Trimethyl gallium for example may be introduced into the gas introducing tube 12 at the downstream of discharging space to dispose gallium nitride compound semiconductor on a substrate.

The temperature of the substrate may vary from approximately 100 to 600° C. If the temperature of the substrate is too high and/or the flow rate of raw gas source of IIIA family elements is not sufficient microcrystals are likely formed. More specifically if the temperature of the substrate is less than 300° C. and if the flow rate of raw gas source of IIIA family elements is much lower then microcrystals will be formed. If the temperature of the substrate is over 300° C. the microcrystals may be formed even when the flow rate of raw gas source of IIIA family elements is sufficiently higher than the low temperature condition. Furthermore, when H2 discharge is performed microcrystallization may be promoted well. Some organic metal compounds including In and Al for example may be used either instead of or mixed in addition to trimethyl gallium.

The abovementioned organic metal compounds may be introduced separately through the gas introducing tube 11.

One or more elements selected from a group of C, Si, Ge and Sn or one or more elements selected from a group of Be, Mg, Ca, Zn and Sr may be introduced at the downstream of the discharging space (through the gas introducing tube 11 or gas introducing tube 12) to obtain amorphous or microcrystalline or crystalline compound semiconductor layer of arbitrarily conductive type such as n- or p-type. When using C, carbon in an organic metal compound may be used depending on the practical condition.

In the apparatus as have been described above, active nitrogen or active hydrogen developed by the discharging energy may be independently controlled, or a gas including both hydrogen and nitrogen such as $NH_3$ maybe used. Also $H_2$ maybe further added. The condition that active hydrogen is released from the organic metal compound can be applied thereto. The activated atoms of IIIA family and of nitrogen may remain on the substrate in a well controlled status, while at the same time hydrogen atoms inactivate methyl and ethyl groups into inert methane and ethane molecules to prevent carbon from penetrating even at a low temperature, and to produce amorphous or microcrystalline or crystalline film with film defects well controlled.

The activation methods usable in the activator-feeder in the above mentioned apparatus include direct current discharging, low frequency discharging, high frequency discharging, microwave discharging, electron-cyclotron resonance, helicon-plasma, as well as heated filament. Any one single or two or more methods in combination may be used. The high frequency discharging may be either of induction coupling or capacitive coupling.

For using two or more activation methods in one space, discharging must be produced at the same time at the same pressure. Thus the pressure in the microwave waveguide (or in the high frequency waveguide) may be differed from that in the quartz tube (or in the reactor). When the pressure is at the same level in both spaces, different activation methods such as microwave discharging and high frequency discharging may be used simultaneously to considerably modify the excitation energy of active elements. This allows controlling the quality of layers.

In accordance with the present invention, reactive deposition, ionized planing, reactive spatter may be used for depositing layers in an environment with at least hydrogen being activated.

The solar cell in accordance with the present invention may define a compound semiconductor layer on a substrate using one of methods described above. The solar cell in accordance with the present invention may generate photovoltaic force at the shot-key barrier in the simplest way. In addition, by laminating p- and n-types, or p- and i- and n-types layers, a solar cell in accordance with the present invention may provide a much better efficiency.

The solar cell having compound semiconductor layer including nitride compound semiconductor formed on a substrate in accordance with the present invention is a very high efficiency solar cell, excellent in light-, heat-, acid-resistances, and in the generative power per unit weight, applicable in broader fields such as mobile gears, automobiles, residences, and spacecrafts.

EXAMPLES

Some representative examples of the present invention will be described below. It should be noted that the following examples are presented solely by way of examples, and the present invention is not limited thereto.

Example 1

A p-type Si substrate, rinsed, with 2 Ω/cm of specific resistance in the orientation (100), was mounted on the substrate holder 3. After the aspiration of the reactor 1 up to vacuum through the exhaust tube 2 the substrate was heated to approximately 380° C. by means of the heater 4. $N_2$ gas of 2000 sccm was introduced from the gas introducing tube 9 of the first activator-feeder 13 into the cylindrical quartz tube 5 of 25 mm in diameter. Microwaves set to 250 W output via the microwave waveguide 8 at 2.45 GHz was matched by a tuner to discharge therein. The reflected wave at this time was at 0 W. Then $H_2$ gas of 500 sccm was introduced from the gas introducing tube 10 of the second activator-feeder 14 into the cylindrical quartz tube 6 of 30 mm in diameter. The high frequency output set to 100 W at 13.56 MHz was introduced. The reflected wave at this time was at 0 W.

In this environment, 1 sccm vapor of trimethyl gallium (TMGa) held at 0° C. was introduced while bubbling from the gas introducing tube 11 of the first activator-feeder 13 through a mass flow controller with nitrogen as the carrier gas. Furthermore, silane diluted with hydrogen was introduced so as to become 1 atom %. The reactive pressure measured by a balatron vacuum gage was 65 Pa. After 60 minutes of deposition, a Si-doped GaN layer of 0.1 μm (an n-type compound semiconductor layer) was directly formed on a p-type Si substrate.

The hydrogen composition in this GaN layer measured by an HFS (hydrogen forward scatter) was 5 atom %. The optical gap in this layer was 3.2 eV, allowing the light of wavelengths longer than 380 nm to be totally transmitted. ITO, transparent conductive electrodes was formed thereon to obtain a semiconductor device.

Using this semiconductor device as a solar cell, the results showed that in the photoelectric current spectra measured in the range of 300 to 800 nm, the quantum effect was stable from long wavelength domain to 400 nm, and the cell had high sensitivity up to 360 nm. The photoelectromotive force was 0.6 V. These results indicate that the Si-doped GaN layer has an excellent functionality as a window layer.

Example 2

A substrate identical to that used in the above example 1 was used. The procedure was similar except that trimethyl aluminium (TMAl) held at 20° C. of the amount ⅕ of Ga was introduced through the gas introducing tube 12 of the second activator-feeder 14. An n-type Si-doped hydride AlGaN layer (composition $Al_{0.2}\ Ga_{0.8}\ N$) was directly formed on the p-type Si substrate. It was found that a hexagonal (0001) crystal was grown by the measurement of X-ray diffractive pattern of n-type AlGaN layer deposited on the p-type Si substrate.

Using this semiconductor device as a solar cell, the measurement of photoelectric current spectra in the range of 300 to 800 nm showed that the quantum effect in the range from long wavelengths up to 380 nm was stable, with high sensitivity up to 340 nm, and the light even in the ultraviolet domain may sufficiently be used. The photoelectromotive force was 0.6 V. These results indicate that the Si-doped hydride AlGaN layer has the excellent functionality as a window layer.

Example 3

An n-type Si-doped hydride AlGaN layer was formed in accordance with the procedure identical to the example 2 above, using a rinsed p-type GaAs substrate of orientation (100).

Using this semiconductor device as a solar cell, the measurement of photoelectric current spectra in the range of 300 to 800 nm showed that the quantum effect in the range from long wavelengths up to 380 nm was stable, with high sensitivity up to 340 nm, and the light even in the ultraviolet domain may sufficiently be used. The photoelectromotive force was 0.7 V. These results indicate that the Si-doped hydride AlGaN layer has an excellent functionality as a window layer.

Example 4

1 μm thick Mo was formed by a sputter on a rinsed soda glass and then 2 μm polycrystalline p-type $CuInSe_2$ was formed thereon by the simultaneous deposition. This substrate was used for further forming thereon an n-type Si-doped hydride AlGaN layer in accordance with the procedure similar to the example 2 above.

Using this semiconductor device as a solar cell, the measurement of photoelectric current spectra in the range of 300 to 800 nm showed that the quantum effect in the range from long wavelengths up to 380 nm was stable, with high sensitivity up to 340 nm, and the light even in the ultraviolet domain may sufficiently be used. The photoelectromotive force was 0.7 V. These results indicate that the Si-doped hydride AlGaN layer has an excellent functionality as a window layer.

Example 5

A p-type Si substrate, rinsed, with the crystalline orientation (100), was mounted on the substrate holder 3. After the aspiration of the reactor 1 up to vacuum through the exhaust tube 2 the substrate was heated to approximately 400° C. by means of the heater 4. $N_2$ gas of 1000 sccm was introduced from the gas introducing tube 9 of the first activator-feeder 13 into the cylindrical quartz tube 5 of 25 mm in diameter. Microwaves set to 250 W output via the microwave waveguide 8 at 2.45 GHz was matched by a tuner to discharge therein. The reflected wave at this time was at 0 W. Then H2 gas of 200 sccm was introduced from the gas introducing tube 10 of the second activator-feeder 14 into the cylindrical quartz tube 6 with 30 mm diameter. The high frequency output set to 100 W at 13.56 MHz was introduced. The reflected wave at this time was at 0 W.

In this environment, 1 sccm vapor of trimethyl gallium (TMGa) held at 0° C. was introduced while bubbling from the gas introducing tube 11 of the first activator-feeder 13 through a mass flow controller with nitrogen as the carrier gas. Thereafter 0.1 sccm vapor of trimethyl indium (TMIn) held at 20° C. was introduced by bubbling from the gas introducing tube 12 of the second activator-feeder 14. The reactive pressure measured by a balatron vacuum gage was 65.5 Pa. After 60 minutes of deposition, 0.3 μm GaInN layer (composition of nitride compound semiconductor $Ga_{0.8}\ In_{0.2}$ N) was directly formed on a p-type Si substrate.

The composition in this GaInN layer measured by a RBS (Rutherford Back Scattering) revealed a total of composition ratio of IIIA family elements with respect to the nitrogen ratio, i.e., the value (Ga+In)/N of 0.95. The composition ratio of In with respect to the total of IIIA elements, i.e., In/(Ga+In) was 0.2. The optical gap of this layer was 2.6 eV, the theoretical conversion rate approximately 30% or more.

The undoped GaInN layer was n-type. A combination of p-type Si substrate with n-type GaInN layer (composition $Ga_{0.8}\ In_{0.2}$ N) showed no barrier for conductive band in the junction at the time of bonding, no barrier for charged electron band, no barrier for electron-holes, and a considerably quick delivery of generated current.

The conversion rate was 15%, measured by a digital multimeter 4140B (available from Hewlett Packard) as photoelectromotive characteristics by irradiating light of AM 1.0. The photoelectromotive force was as high as 1.2 V.

Example 6

An n-type doped GaInN layer formed on a p-type Si substrate was formed, using the substrate identical to that used in the example 5 above, with the same procedure except for 1000 ppm silane diluted with hydrogen introduced through the gas introducing tube 11 of the first activator-feeder 13. The composition of GaInN layer was similar to that of example 1.

The n-type GaInN layer (composition $Ga_{0.8} In_{0.2} N$) on the p-type Si substrate revealed no barrier for conductive band in the junction at the time of bonding, no barrier for charged electron band, no barrier for electron-holes, and a considerably quick delivery of generated current. It was found that a hexagonal (0001) crystal was grown by the measurement of X-ray diffractive pattern of n-type GaInN layer deposited on the p-type Si substrate.

The conversion rate was 17%, measured by the same instrument as photoelectromotive characteristics by irradiating light of AM 1.0. The photoelectromotive force was as high as 1.5 V.

Example 7

A substrate identical to that used in the example 5 above was used and heated at 400° C. in accordance with the procedure similar to that of example 5 above. $N_2$ gas of 1000 sccm was introduced from the gas introducing tube 9 of the first activator-feeder 13 into the cylindrical quartz tube 5 with 25 mm diameter. Microwaves set to 250 W output via the microwave waveguide 8 at 2.45 GHz was matched by a tuner to discharge therein. The reflected wave at this time was at 0 W. Then $H_2$ gas of 200 sccm was introduced from the gas introducing tube 10 of the second activator-feeder 14 into the cylindrical quartz tube 6 of 30 mm in diameter. The high frequency output set to 100 W at 13.56 MHz was introduced. The reflected wave at this time was at 0 W.

In this environment, 1 sccm vapor of trimethyl gallium (TMGa) held at 0° C. was introduced while bubbling from the gas introducing tube 11 of the first activator-feeder 13 through a mass flow controller with nitrogen as the carrier gas. Then 2 sccm trimethyl indium (TMIn) held at 20° C. and mixed with 1000 ppm silane diluted with hydrogen was introduced from the gas introducing tube 12 of the second activator-feeder 14 with nitrogen as carrier gas. Furthermore, 1000 ppm of silane diluted with hydrogen was introduced through the gas introducing tube 11 of the first activator-feeder 13. The reactive pressure measured by a balatron vacuum gage was 65.5 Pa. After 60 minutes of deposition, 0.3 µm n-type GaInN layer (composition of nitride compound semiconductor $Ga_{0.3} In_{0.7} N$) was directly formed on a p-type Si substrate.

The composition in this GaInN layer measured by a RBS (Rutherford Back Scattering) revealed a total of composition ratio of IIIA family elements with respect to the nitrogen ratio, i.e., the value (Ga+In)/N of 0.99. The composition ratio of In with respect to the total of IIIA elements, i.e., In/(Ga+In) was 0.7. The optical gap of this layer was 2.1 eV.

Then, 1 sccm vapor of trimethyl gallium (TMGa) held at 0° C. was introduced while bubbling from the gas introducing tube 11 of the first activator-feeder 13 through a mass flow controller with nitrogen as the carrier gas. Thereafter 0.5 sccm vapor of trimethyl indium (TMIn) held at 20° C. was introduced by bubbling from the gas introducing tube 12 of the second activator-feeder 14 with nitrogen as the carrier gas. In addition 3000 ppm silane diluted wit hydrogen was introduced through the gas introducing tube 14 of the second activator-feeder 14. The reactive pressure measured by a balatron vacuum gage at this time was 65.5 Pa. After 30 minutes of deposition, n-type doped 0.1 µm GaInN layer (composition $Ga_{0.7} In_{0.3} N$) was formed on the 0.3 µm n-type GaInN layer (composition $Ga_{0.7} In_{0.3} N$).

The composition in this GaInN layer measured by a RBS (Rutherford Back Scattering) revealed a total of composition ratio of IIIA family elements with respect to the nitrogen ratio, i.e., the value (Ga+In)/N of 0.99. The composition ratio of In with respect to the total of IIIA elements, i.e., In/(Ga+In) was 0.3. The optical gap of this layer was 2.5 eV.

The n-type GaInN layer (composition $Ga_{0.3} In_{0.7} N$), with respect to the p-type Si substrate, revealed no barrier for conductive band in the junction at the time of bonding, no barrier for charged electron band. The GaInN layer with respect to another n-type GaInN layer (composition $Ga_{0.7} In_{0.3} N$) formed thereon revealed no barrier for electron-holes, internal fields generated and a considerably quick delivery of generated current. The theoretical conversion rate obtained from this combination was 45%.

The conversion rate was 20%, measured by the same instrument as photoelectromotive characteristics by irradiating light of AM 1.0. The photoelectromotive force was as high as 1.2 V.

Example 8

Two GaInN layers were formed on an n-type Si substrate, rinsed, with the orientation (100) in accordance with the procedure identical to the example 7 above. The procedure was similar except for 2000 ppm of cyclopentadienyl Mg introduced instead of hydrogen-diluted silane for the first GaInN layer contacting with n-type Si substrate, and for 5000 ppm of cyclopentadienyl Mg introduced instead of hydrogen-diluted silane for the second GaInN layer deposited on the first GaInN layer. These first and second GaInN layers became both p-type.

The p-type GaInN layer (composition $Ga_{0.3} In_{0.7} N$), with respect to the n-type Si substrate, revealed no barrier for conductive band in the junction at the time of bonding, no barrier for charged electron band. The first GaInN layer with respect to another, second p-type GaInN layer (composition $Ga_{0.7} In_{0.3} N$) formed thereon revealed no barrier for electron-holes, internal fields generated and a considerably quick delivery of generated current. The theoretical conversion rate obtained from this combination was 45%.

The conversion rate was 22%, measured by the same instrument as photoelectromotive characteristics by irradiating light of AM 1.0. The photoelectromotive force was as high as 1.2V.

Example 9

Two GaInN layers were formed on a p-type Si substrate, rinsed, with the orientation (100) in accordance with the procedure identical to the example 7 above. The procedure was similar except for 1000 ppm of cyclopentadienyl Mg introduced instead of hydrogen-diluted silane for the first GaInN layer contacting with p-type Si substrate, and for 5000 ppm of cyclopentadienyl Mg introduced instead of hydrogen-diluted silane for the second GaInN layer deposited on the first GaInN layer. The first GaInN layer became i-type while second GaInN layer n-type.

The i-type GaInN layer (composition $Ga_{0.3} In_{0.7} N$) with respect to the p-type Si substrate, revealed no barrier for conductive band in the junction at the time of bonding, no barrier for charged electron band. The first GaInN layer with respect to another, second n-type GaInN layer (composition $Ga_{0.7}In_{0.3}N$) formed thereon revealed no barrier for electron-holes, internal fields generated and a considerably quick delivery of generated current. The theoretical conversion rate obtained from this combination was 45%.

The conversion rate was 20%, measured by the same instrument as photoelectromotive characteristics by irradiating light of AM 1.0. The photoelectromotive force was as high as 1.3 V.

In conclusion, the present invention may provide a semiconductor device and solar cell, which may be low-cost, highly efficient, safe, and last long.

What is claimed is:

1. A semiconductor device, comprising a first semiconductor layer, deposited as a window layer on a second semiconductor layer, the window layer containing a compound semiconductor of a nitride compound composed of nitrogen element and one or more elements selected from the group consisting of Al, Ga, and In, and further containing halogen elements or a mixture of halogen elements and hydrogen in an amount of 0.1 to 40 atom %.

2. A semiconductor device according to claim 1, wherein the second semiconductor layer has p-type conductivity; and the window layer contains one or more elements selected from the group consisting of C, Si, Ge and Sn.

3. A semiconductor device according to claim 1, wherein the second semiconductor has n-type conductivity; and the window layer contains one or more elements selected from the group consisting of Be, Mg, Ca, Zn and Sr.

4. A semiconductor device according to claim 1, wherein the second semiconductor layer is made of silicon.

5. A semiconductor device according to claim 4, wherein the silicon is selected from the group consisting of crystalline silicon, polycrystalline silicon, microcrystalline silicon, and amorphous silicon.

6. A semiconductor device according to claim 1, wherein the second semiconductor layer is made of P and/or As and further made of one or more elements selected from the IIIA family elements in the periodic table.

7. A semiconductor device according to claim 1, wherein the second semiconductor layer is made of a chalcopyrite compound including Cu.

8. A semiconductor device according to claim 1, further comprising an intermediate layer including In element provided between the second semiconductor layer and the window layer.

9. A semiconductor device according to claim 8, wherein the intermediate layer has plural layers each having a different concentration of In element.

10. A semiconductor device according to claim 9, wherein the In element concentration in the plural layers is gradually decreased toward the direction of incident light.

11. A semiconductor device according to claim 8, wherein the window layer and the intermediate layer contain one or more elements selected from the group consisting of C, Si, Ge and Sn; and the concentration of the one or more elements contained in the intermediate layer is lower than the concentration of the one or more elements contained in the window layer.

12. A semiconductor device according to claim 8, wherein the window layer and intermediate layer contain one or more elements selected from the group consisting of Be, Mg, Ca, Zn and Sr; and the concentration of the one or more elements contained in the intermediate layer is lower than the concentration of the one or more elements contained in the window layer.

13. A semiconductor device according to claim 8, wherein the window layer and intermediate layer are formed at 600° C. or lower.

14. A solar cell, comprising:

a compound semiconductor layer containing a nitride compound semiconductor expressed by a composition $Al_XGa_YIn_ZN_W$ on a semiconductor layer;

wherein the X, Y, Z and W represent a composition ratio, and wherein the X, Y, Z and W satisfy $$0.8 \leq (X+Y+Z)/W \leq 1.2$$

and $$0.1 \leq Z/(X+Y+Z) \leq 1.0,$$

and further containing halogen elements or a mixture of halogen elements and hydrogen in an amount of 0.1 to 40 atom %.

15. A solar cell, comprising:

a substrate;

a first compound semiconductor layer containing a nitride compound semiconductor expressed by a composition $Al_{X1}Ga_{Y1}In_{Z1}N_{W1}$ on the substrate;

a second compound semiconductor layer containing a nitride compound semiconductor expressed by a composition $Al_{X2}Ga_{Y2}In_{Z2}N_{W2}$ on the first compound semiconductor layer;

wherein the X1, Y1, Z1 represent a composition ratio, satisfying the following expression: $0.6 \leq Z1/(X1+Y1+Z1) \leq 1.0$;

wherein the X2, Y2, Z2 represent a composition ratio, satisfying the following expression: $0 \leq Z2/(X2+Y2+Z2) \leq 0.9$;

wherein Z1 and Z2 satisfy the condition $Z2 \leq Z1$; and wherein W1 and W2 must satisfy the following expressions: $0.8 \leq (X1+Y1+Z1)/W1 \leq 1.2$ and $0.8 \leq (X2+Y2+Z2)/W2 \leq 1.2$.

* * * * *